(12) United States Patent
Cheng (10) Patent No.: US 11,726,138 B2
(45) Date of Patent: Aug. 15, 2023

(54) METHOD FOR TESTING SEMICONDUCTOR DIES AND TEST STRUCTURE

(71) Applicant: NANYA TECHNOLOGY CORPORATION, New Taipei (TW)

(72) Inventor: Tse Yu Cheng, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/645,316

(22) Filed: Dec. 21, 2021

(65) Prior Publication Data

US 2023/0194596 A1 Jun. 22, 2023

(51) Int. Cl.
*G01R 1/02* (2006.01)
*G01R 1/04* (2006.01)
*G01R 1/067* (2006.01)
*G01R 1/073* (2006.01)
*G01R 31/26* (2020.01)
*G01R 31/28* (2006.01)

(52) U.S. Cl.
CPC .............................. *G01R 31/2886* (2013.01)

(58) Field of Classification Search
CPC . G01R 1/02; G01R 1/04; G01R 1/067; G01R 1/073; G01R 31/02; G01R 31/04; G01R 31/26; G01R 31/28
See application file for complete search history.

(56) References Cited

U.S. PATENT DOCUMENTS

| 5,825,171 | A | * | 10/1998 | Shin | G01R 31/2849 324/750.05 |
| 8,008,940 | B2 | * | 8/2011 | Takase | G01R 31/31905 324/762.01 |
| 2007/0096760 | A1 | * | 5/2007 | Cheng | G01R 1/0483 324/756.05 |
| 2011/0057664 | A1 | * | 3/2011 | Miyata | G01R 1/07371 324/537 |

* cited by examiner

*Primary Examiner* — Neel D Shah
(74) *Attorney, Agent, or Firm* — CKC & Partners Co., LLC (57) ABSTRACT

A method includes providing a test structure above a tester, wherein the test structure includes a load board including a first and second connectors, a first socket electrically connected to the first and second connectors of the load board, and a second socket electrically isolated from the first connector of the load board and electrically connected to the second connector of the load board. A first and second semiconductor dies are disposed respectively on the first and second sockets. A test signal to the first semiconductor die and the second semiconductor die through the second connector of the load board are simultaneously applied by using the tester. A first signal of the first semiconductor die through the first connector is read by using the tester. Whether the first semiconductor die is disturbed by the second semiconductor die is determined according to the first signal.

15 Claims, 6 Drawing Sheets

METHOD FOR TESTING SEMICONDUCTOR DIES AND TEST STRUCTURE

BACKGROUND

Technical Field

The present disclosure relates to a method for testing semiconductor dies and a test structure.

Description of Related Art

Technological development in the semiconductor industry has become smaller in size while having greater functionality and greater amounts of integrated circuitry. Due to the miniaturized scale of semiconductor dies, various types and dimensions of semiconductor dies performing different functions are integrated and packaged into a single module. Furthermore, numerous manufacturing operations are implemented for integration of various types of semiconductor dies.

SUMMARY

One aspect of the present disclosure is a method for testing semiconductor dies.

According to some embodiments of the present disclosure, a method for testing semiconductor dies includes providing a test structure above a tester, wherein the test structure includes a load board including a first connector and a second connector, a first socket electrically connected to the first connector and the second connector of the load board, and a second socket electrically isolated from the first connector of the load board and electrically connected to the second connector of the load board. A first semiconductor die and a second semiconductor die are disposed respectively on the first socket and the second socket. A test signal to the first semiconductor die and the second semiconductor die through the second connector of the load board is simultaneously applied by using the tester. A first signal of the first semiconductor die through the first connector is read by using the tester. Whether the first semiconductor die is disturbed by the second semiconductor die is determined according to the first signal.

In some embodiments, the test structure further includes a third connector electrically connected to the second socket but electrically isolated from the first socket. The method for testing semiconductor dies further includes reading, by using the tester, a second signal of the second semiconductor die through the third connector after reading the first signal. Whether the second semiconductor die is disturbed by the first semiconductor die is determined according to the second signal.

In some embodiments, a path length of the second connector from the tester to the first socket is substantially the same as a path length of the second connector from the tester to the second socket.

In some embodiments, wherein the first semiconductor die and the second semiconductor die are dynamic random access memory (DRAM) dies.

In some embodiments, the first socket is fixed on a top surface of the load board.

In some embodiments, the test structure further includes an interposer inserted to the load board, and the first socket and the second socket are fixed on the interposer.

Another aspect of the present disclosure is a test structure.

According to some embodiments of the present disclosure, a test structure includes a load board, a first socket and a second socket. The load board includes shared connectors and independent connectors. The first socket and the second socket are above the load board, wherein the shared connectors include a first connector, a second connector, and a third connector, and wherein the first connector, the second connector, and the third connector are electrically connected to the first socket and the second socket.

In some embodiments, the independent connectors include a first independent connector electrically connected to the first socket but electrically isolated from the second socket.

In some embodiments, the independent connectors include a second independent connector electrically connected to the second socket but electrically isolated from the first socket.

In some embodiments, a path length of the first connector of the shared connectors from a surface of the load board to the first socket is substantially the same as a path length of the first connector of the shared connectors from a surface of the load board to the second socket.

In some embodiments, the first socket is fixed on a top surface of the load board.

In some embodiments, the first connector of the shared connectors extends from a bottom surface of the load board to a top surface of the load board, wherein the top surface of the load board is in contact with the first socket and the second socket.

In some embodiments, the test structure further includes an interposer inserted to the load board, and the first socket and the second socket are fixed on the interposer.

In some embodiments, the interposer includes a first connector electrically connected to the first connector of the shared connectors of the load board.

In some embodiments, the interposer includes a second connector electrically connected to one of the independent connectors of the load board, and the second connector of the interposer is electrically connected to the first socket but electrically isolated from the second socket.

In the aforementioned embodiments, since the first signal of the first semiconductor die through the first connector is read, whether the first semiconductor die is disturbed by the second semiconductor die can be determined. The interference (e.g., interference of the electric field) or compatibility problem between the first semiconductor die and the second semiconductor die can be detected.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
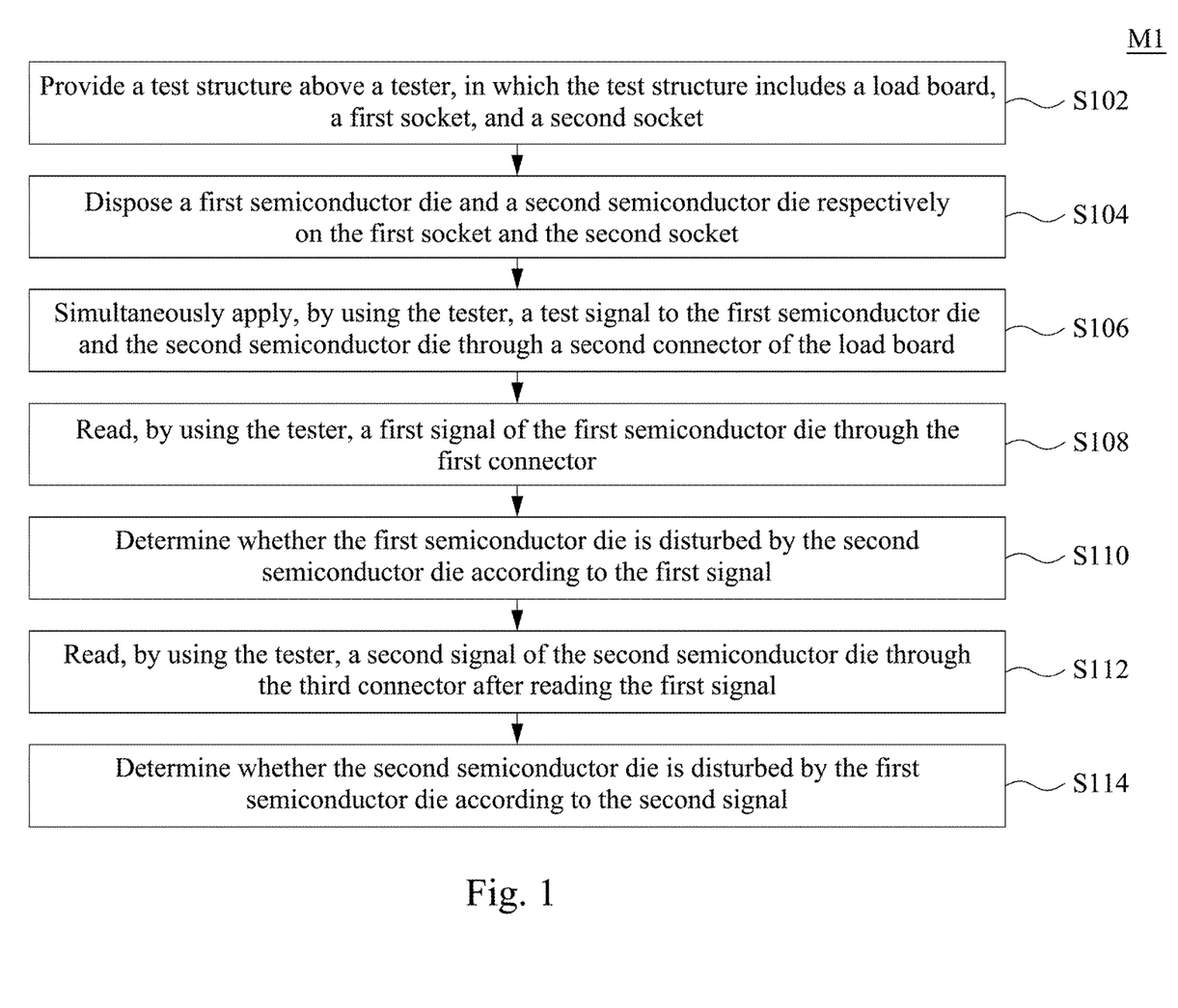
FIG. 1 illustrates a block diagram of a method for testing a plurality semiconductor dies in accordance with some embodiments.

Referring now to FIG. 1, illustrated is an exemplary method M1 for testing a plurality of semiconductor dies in accordance with some embodiments. The method M1 includes a relevant part of the entire testing process. It is understood that additional operations may be provided before, during, and after the operations shown by FIG. 1, and some of the operations described below can be replaced or eliminated for additional embodiments of the method. The order of the operations/processes may be interchangeable. The method M1 includes testing method for a plurality semiconductor dies (e.g., a first semiconductor die 140 and a second semiconductor die 150).

Figure 2:
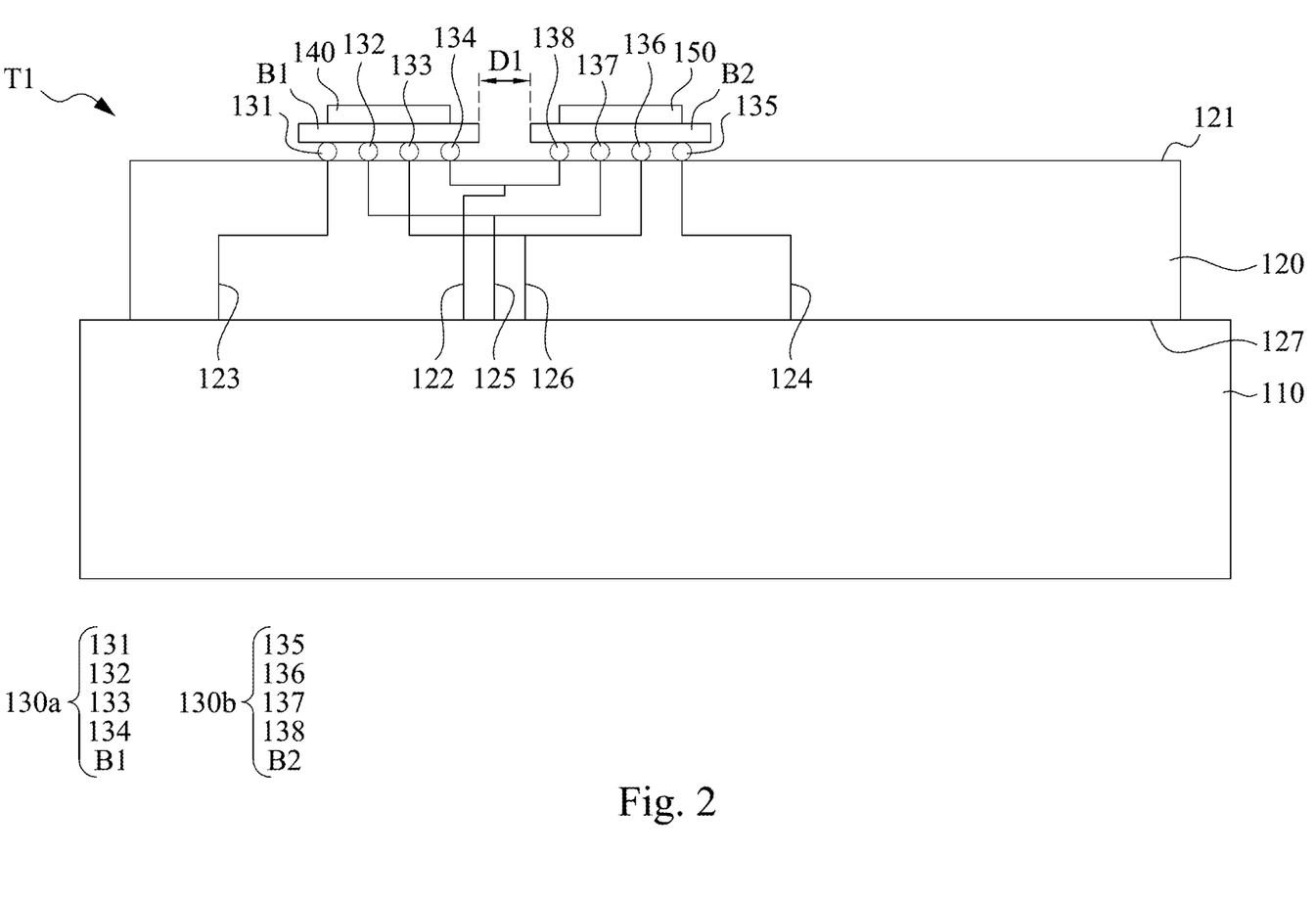
FIG. 2 is a schematic view of a test structure for testing a plurality semiconductor dies in accordance with some embodiments of the present disclosure.

FIG. 2 is a schematic view of a test structure T1 for testing a plurality semiconductor dies in accordance with some embodiments of the present disclosure. Referring to FIG. 1 and FIG. 2, at block S102 of the method M1, a test structure T1 is provided above a tester 110. The test structure T1 includes a load board 120, a first socket 130a, and a second socket 130b. The load board 120 includes first connectors and second connectors. In some embodiments, the first connectors are independent connectors, and the second connectors are shared connectors. The first connectors include a first independent connector 123 and a second independent connector 124. The second connectors include a drive connector 122, a first I/O connector 125, and a second I/O connector 126. The first socket 130a is electrically connected to the first independent connector 123, the drive connector 122, the first I/O connector 125, and the second I/O connector 126 of the load board 120. The second socket 130b is electrically isolated from the first independent connector 123 of the load board 120 and electrically connected to the second independent connector 124, the drive connector 122, the first I/O connector 125, and the second I/O connector 126 of the load board 120. At block S104 of the method M1, a first semiconductor die 140 and a second semiconductor die 150 are respectively disposed on the first socket 130a and the second socket 130b. At block S106 of the method M1, a test signal to the first semiconductor die 140 and the second semiconductor die 150 through the second connector of the load board 120 is simultaneously applied by using the tester 110. In some embodiments, the test signal to the first semiconductor die 140 and the second semiconductor die 150 through the drive connector 122 of the load board 120 is simultaneously applied by using the tester 110. In some other embodiments, the test signal to the first semiconductor die 140 and the second semiconductor die 150 through the first I/O connector 125 of the load board 120 is simultaneously applied by using the tester 110. Alternatively, the test signal to the first semiconductor die 140 and the second semiconductor die 150 through the second I/O connector 126 of the load board 120 is simultaneously applied by using the tester 110. At block S108 of the method M1, a first signal of the first semiconductor die 140 through the first connector (e.g., first independent connector 123) of the load board 120 is read by using the tester 110. At block S110 of the method M1, whether the first semiconductor die 140 is disturbed by the second semiconductor die 150 is determined according to the first signal. In greater details, the first signal is compared with a first predetermined signal. The first predetermined signal is a signal of a new first semiconductor die or the first semiconductor die 140 isolated from the second semiconductor die 150 (e.g., when the first semiconductor die 140 is disposed on the first socket 130a and the second semiconductor die 150 is not disposed on the second socket 130b). If the first signal is substantially the same as the first predetermined signal, the first semiconductor die 140 may be not disturbed by the second semiconductor die 150; if the first signal is different from the first predetermined signal, the first semiconductor die 140 may be disturbed by the second semiconductor die 150. As such, the method M1 is beneficial for detecting signals (e.g., the first signal) of the semiconductor dies (e.g., the first semiconductor die 140). The interference (e.g., interference of the electric field) or compatibility problem between the first semiconductor die 140 and the second semiconductor die 150 can be detected.

Further, the test structure T1 includes a third connector (e.g., the second independent connector 124) electrically connected to the second socket 130b but electrically isolated from the first socket 130a. At block S112 of the method M1, a second signal of the second semiconductor die 150 through the third connector (e.g., the second independent connector 124) is read by using the tester 110 after reading the first signal. At block S114, whether the second semiconductor die 150 is disturbed by the first semiconductor die 140 is determined according to the second signal. In greater details, the second signal is compared with a second predetermined signal. The second predetermined signal is a signal of a new second semiconductor die or the second semiconductor die 150 isolated from the first semiconductor die 140 (e.g., when the second semiconductor die 150 is disposed on the second socket 130b and the first semiconductor die 140 is not disposed on the first socket 130a). If the second signal is substantially the same as the second predetermined signal, the second semiconductor die 150 may be not disturbed by the first semiconductor die 140; if the first signal is different from the second predetermined signal, the second semiconductor die 150 may be disturbed by the first semiconductor die 140 and interference or compatibility problem may exist.

In some embodiments, prior to block S104, the load board 120 is performed to calibrate by applying a plurality signals with time difference to the first socket 130a and/or the second socket 140a through each connectors. Since path lengths of each connectors (e.g., the first independent connector 123, the second independent connector 124, the drive connector 122, the first I/O connector 125, and the second I/O connector 126) to the first socket 130*a* (or the second socket 140*a*) are not identical, the signals may not reach the first socket 130*a* (or the second socket 140*a*) simultaneously. As a result, the load board 120 is calibrated by applying the signals with time difference such that the first and second signals can reach the first socket 130*a* (or the second socket 140*a*) simultaneously. For example, since the path length of the drive connector 122 is different from (e.g., greater or smaller than) the path length of the first I/O connector 125, the signal applied by using the tester 110 through the drive connector 122 is earlier or later than the signal applied by using the tester 110 through the first I/O connector 125.

The tester 110 is configured to supply a test signal (e.g., input signal). The first socket 130*a* and the second socket 130*b* are fixed on a top surface 121 of the load board 120, in which the first socket 130*a* is spaced apart from the second socket 130*b*. In some embodiments, a distance D1 between the first socket 130*a* and the second socket 130*b* is in a range of about 10 millimeters to about 100 millimeters. The distance D1 within this range can provide good results, e.g., the interference between the first semiconductor die 140 and the second semiconductor die 150 (if it exists) is close to the actual package design. If the distance D1 is greater than about 100 mm, the interference between the first semiconductor die 140 and the second semiconductor die 150 may be detected too late and not match the actual package design. In some embodiments, the first socket 130*a* includes a base portion B1 and contact pads 131-134 beneath the base portion B1. The first socket 130*a* is configured to hold the first semiconductor die 140 to be tested and interconnects the first semiconductor die 140 and the connectors (e.g., the first independent connector 123, the drive connector 122, the first I/O connector 125, and the second I/O connector 126) in the load board 120. The second socket 130*b* includes a base portion B2 and contact pads 135-138 beneath the base portion B2. The second socket 130*b* is configured to hold the second semiconductor die 150 to be tested and interconnects the second semiconductor die 150 and the connectors (e.g., the second independent connector 124, the drive connector 122, the first I/O connector 125, and the second I/O connector 126) in the load board 120.

In some embodiments, the first semiconductor die 140 is electrically connected to the first independent connector 123 of the load board 120 through the contact pad 131, and the second semiconductor die 150 is electrically connected to the second independent connector 124 of the load board 120 through the contact pad 135. In some embodiments, the first semiconductor die 140 is electrically connected to the contact pads 131-134, and the second semiconductor die 150 is electrically connected to the contact pads 135-138. The contact pad 134 beneath the first semiconductor die 140 is electrically connected to the contact pad 138 beneath the second semiconductor die 150 through the drive connector 122 such that the signal from the tester 110 can reach the first semiconductor die 140 and the second semiconductor die 150 simultaneously through the drive connector 122 and the sockets (i.e., the first socket 130*a* and the second socket 130*b*). Further, the contact pad 132 beneath the first semiconductor die 140 is electrically connected to the contact pad 137 beneath the second semiconductor die 150 through the first I/O connector 125 such that the signal from the tester 110 can reach the first semiconductor die 140 and the second semiconductor die 150 simultaneously through the first I/O connector 125 and the sockets (i.e., the first socket 130*a* and the second socket 130*b*). Similarly, the contact pad 133 beneath the first semiconductor die 140 is electrically connected to the contact pad 136 beneath the second semiconductor die 150 such that the signal from the tester 110 to the second I/O connector 126 can reach the first semiconductor die 140 and the second semiconductor die 150 simultaneously through the second I/O connector 126 and the sockets (i.e., the first socket 130*a* and the second socket 130*b*).

In some embodiments, the drive connector 122, the first I/O connector 125, and the second I/O connector 126 are shared connecters. The first semiconductor die 140 (or the first socket 130*a*) is electrically connected to the second semiconductor die 150 (or the second socket 130*b*) through those shared connectors. In some embodiments, the first independent connector 123 is electrically connected to the first semiconductor die 140 (or the first socket 130*a*) but isolated from the second semiconductor die 150 (or the second socket 130*b*). Similarly, second independent connector 124 is electrically connected to the second semiconductor die 150 (or the second socket 130*b*) but isolated from the first semiconductor die 140 (or the first socket 130*a*).

In some embodiments, a path length of the first I/O connector 125 from the tester 110 to the first socket 130*a* is substantially the same as a path length of the first I/O connector 125 from the tester 110 to the second socket 130*b*. As such, the first semiconductor die 140 and the second semiconductor die 150 can receive the signal from the tester 110 at the same time. In some embodiments, a path length of the second I/O connector 126 from the tester 110 to the first socket 130*a* is substantially the same as a path length of the second I/O connector 126 from the tester 110 to the second socket 130*b*. In some embodiments, a path length of the drive connector 122 from the tester 110 to the first socket 130*a* is substantially the same as a path length of the second I/O connector 126 from the tester 110 to the second socket 130*b*. In some embodiments, each of the connectors (e.g., the first independent connector 123, the second independent connector 124, the drive connector 122, the first I/O connector 125, and the second I/O connector 126) extends from a bottom surface 127 of the load board 120 to the top surface 121 of the load board 120, in which the top surface 121 of the load board 120 is in contact with the first socket 130*a* and the second socket 130*b*.

In some embodiments, the first I/O connector 125 and/or the second I/O connector 126 can operate as an input connector or an output connector. In some embodiments, the first independent connector 123 and the second independent connector 124 are configured to transfer signals from the first semiconductor die 140 and second semiconductor die 150 to the tester 110, individually.

In some embodiments, the contact pads 131-138, the drive connector 122, the first independent connector 123, the second independent connector 124, the first I/O connector 125, and the second I/O connector 126 include aluminum, copper, gold, or other suitable conductive materials. The load board 120 may be formed by using a metal depositing process and patterning process.

In some embodiments, the first semiconductor die 140 and the second semiconductor die 150 include dynamic random access memory (DRAM) dies, static random access memory (SRAM) dies, hybrid memory cube (HMC) modules, or the like. The first semiconductor die 140 and the second semiconductor die 150 may be DRAM dies, in some embodiments.

In some embodiments, the test structure T1 further includes a third semiconductor die and a fourth semiconductor die (not shown), or more. The tester 110 may apply a test signal to the semiconductor dies (the first semiconductor die 140, the second semiconductor die 150, the third semiconductor die, and the fourth semiconductor die) at the same time.

Figure 3:
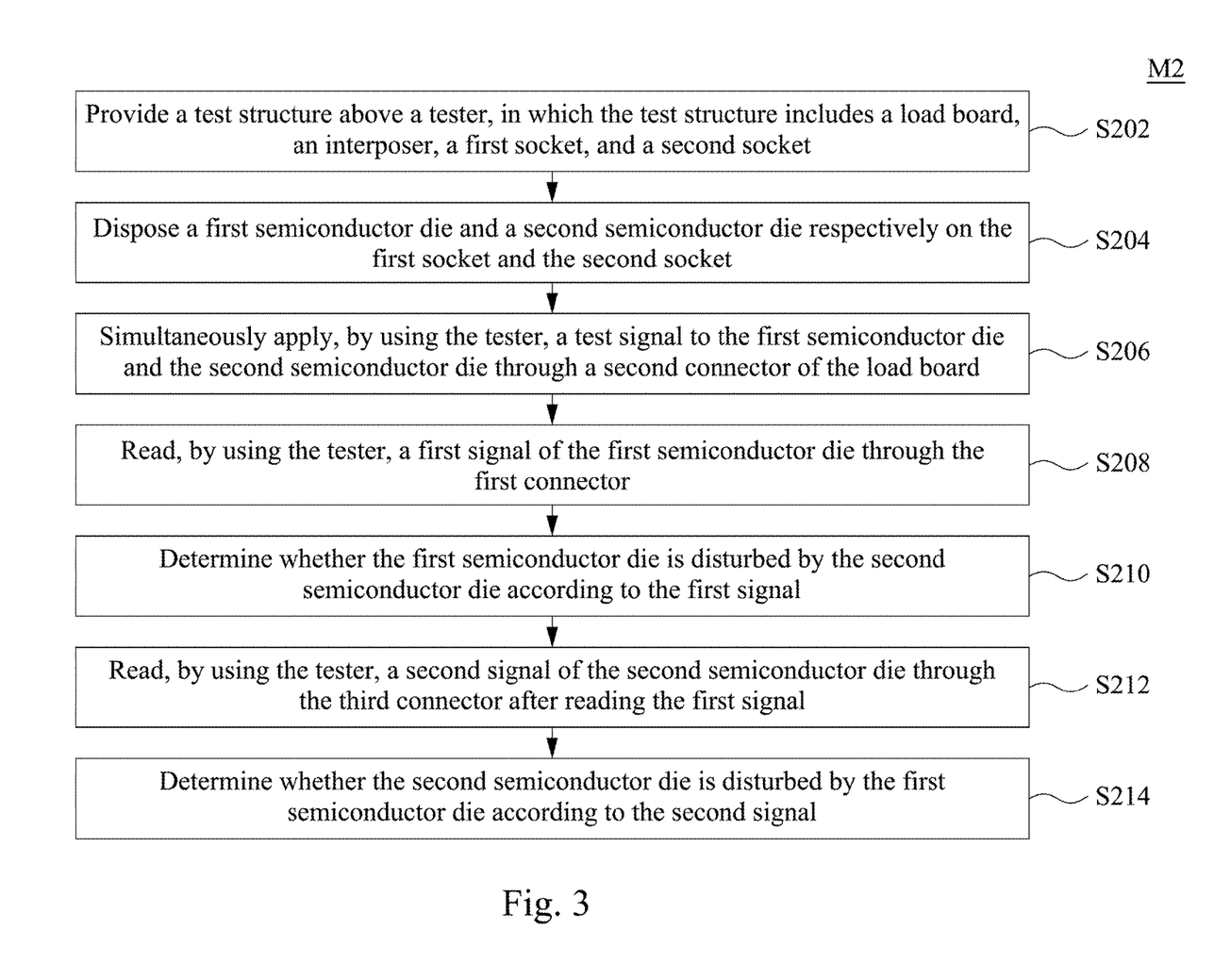
FIG. 3 illustrates a block diagram of a method for testing a plurality semiconductor dies in accordance with some embodiments.
Figure 4:
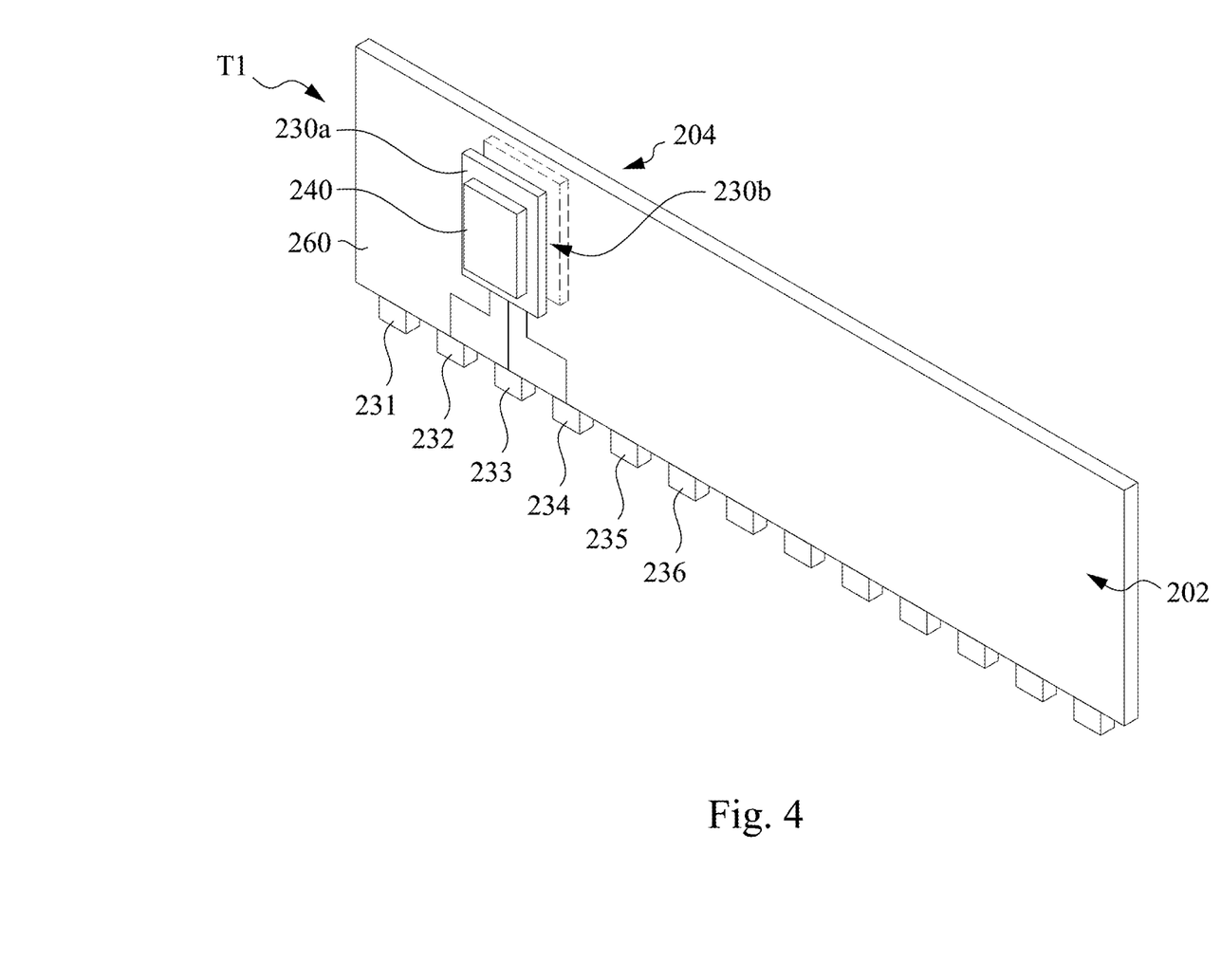
FIG. 4 is a perspective view of a test structure in accordance with another embodiment of the present disclosure.
Figure 5:
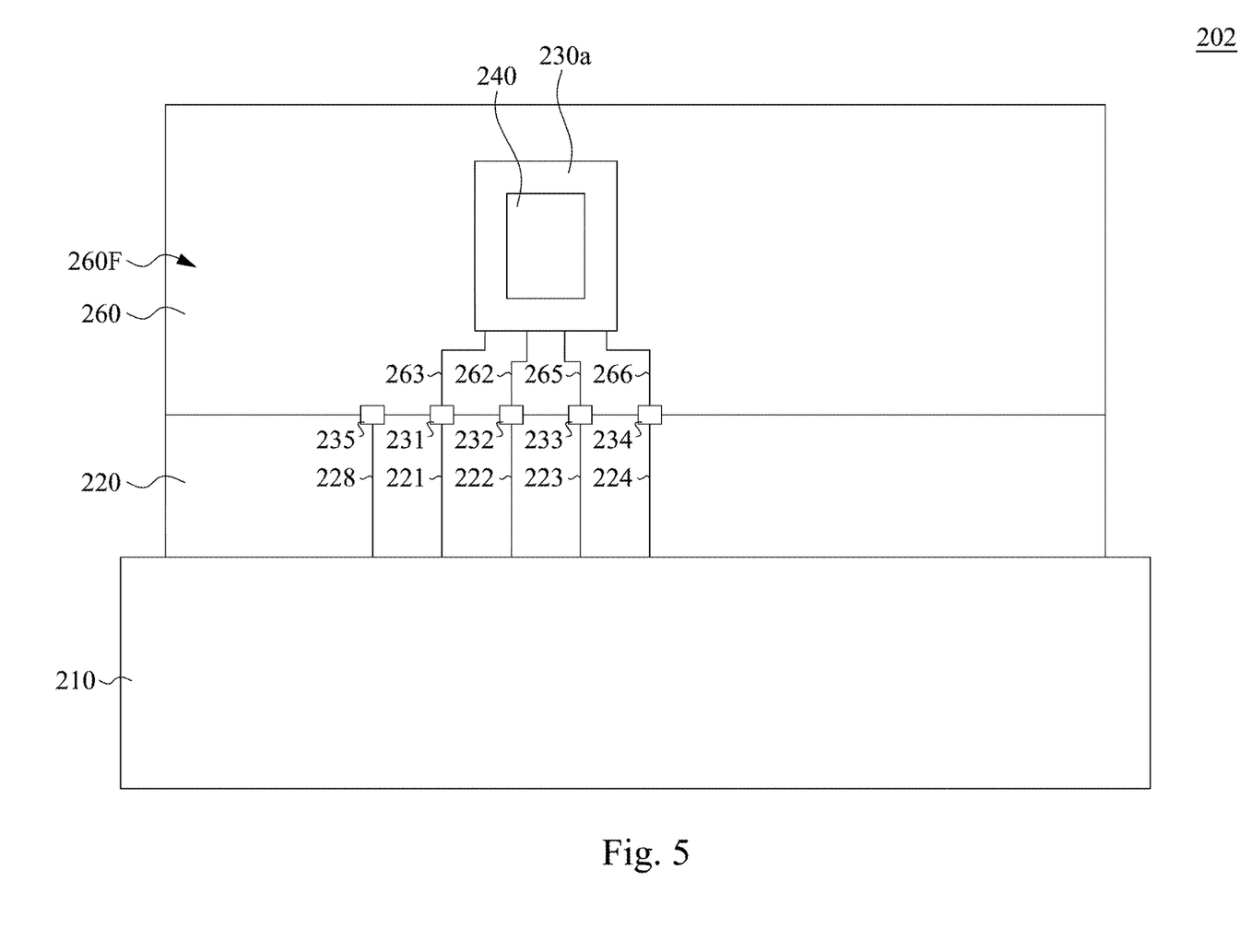
FIG. 5 is a side view illustrating a front side of the test structure of FIG. 4.
Figure 6:
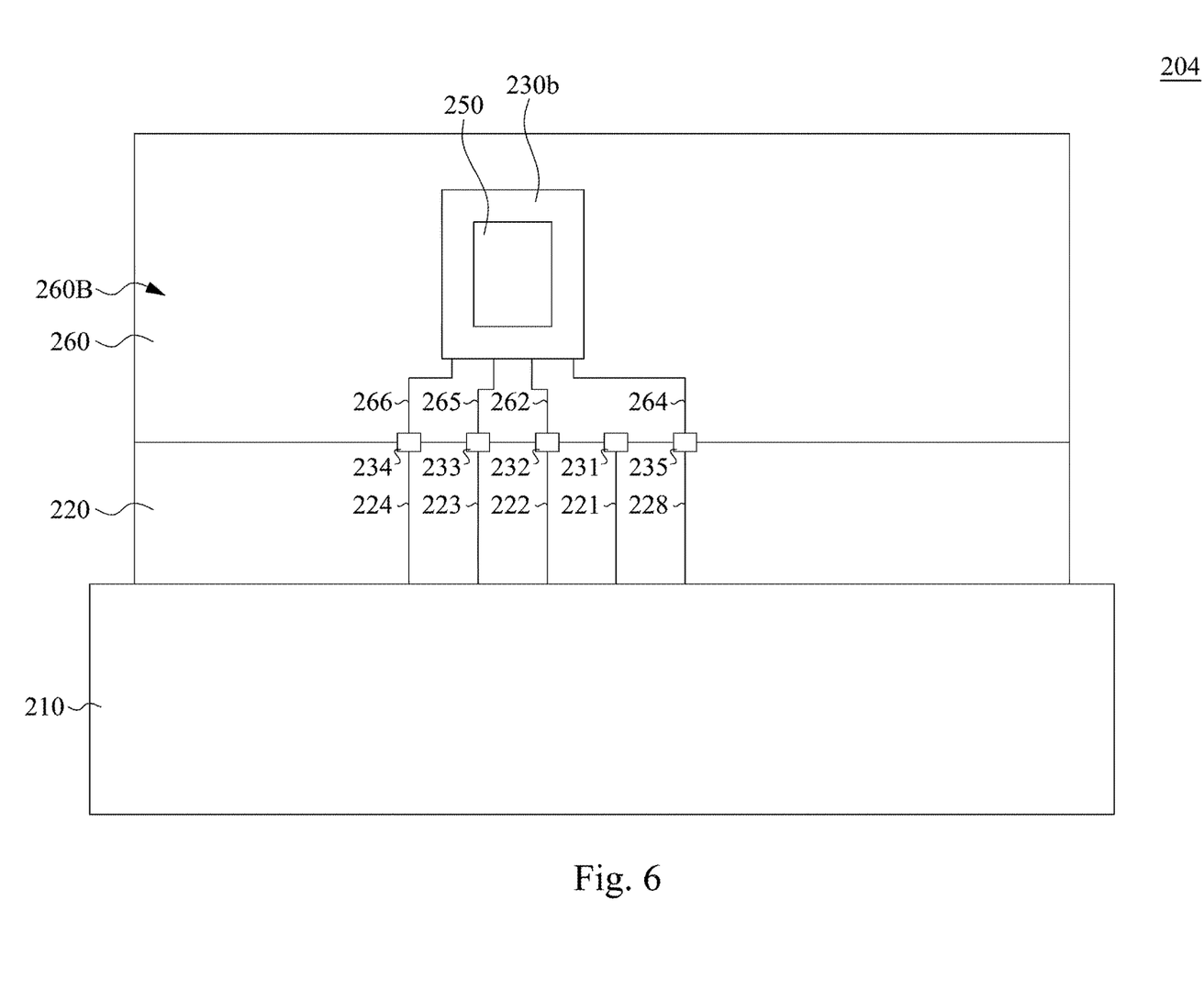
FIG. 6 is a side view illustrating a back side of the test structure of FIG. 4.

FIG. 3 illustrates a block diagram of a method M2 for testing a plurality semiconductor dies in accordance with some embodiments, FIG. 4 is a perspective view of a test structure T2 in accordance with another embodiment of the present disclosure, FIG. 5 is a side view illustrating a front side 202 of the test structure T2 of FIG. 4, and FIG. 6 is a side view illustrating a back side 204 of the test structure T2 of FIG. 4. For clarity, the tester 210 and the load board 220 are illustrated in the side views and are omitted in the perspective view.

Referring to FIGS. 3-6, at block S202 of the method M2, a test structure T2 is provided above a tester 210. The test structure T2 includes a load board 220, an interposer 260, a first socket 230a, and a second socket 230b. The load board 220 includes first connectors and second connectors. In some embodiments, the first connectors are independent connectors, and the second connectors are shared connectors. The first connectors include a first independent connector 221 and a second independent connector 228. The second connectors include a drive connector 222, a first I/O connector 223, and a second I/O connector 224. The interposer 260 includes a first independent connector 263 electrically connected to the first independent connector 221 of the load board 220, a second independent connector 264 electrically connected to the second independent connector 228 of the load board 220, a drive connector 262 electrically connected to the drive connector 222 of the load board 220, a first I/O connector 265 electrically connected to the first I/O connector 223 of the load board 220, and a second I/O connector 266 electrically connected to the second I/O connector 224 of the load board 220. The first socket 230a is electrically connected to the first independent connector 221 of the load board 220 through the first independent connector 263 of the interposer 260, the drive connector 222 of the load board 220 through the drive connector 262 of the interposer 260, the first I/O connector 223 of the load board 220 through the first I/O connector 265 of the interposer 260, and the second I/O connector 224 of the load board 120 through the second I/O connector 266 of the interposer 260. The second socket 230b is electrically isolated from the first independent connector 221 of the load board 120 and electrically connected to the second independent connector 228 of the load board 220 through the second independent connector 264 of the interposer 260, the drive connector 222 of the load board 220 through the drive connector 262 of the interposer 260, the first I/O connector 223 of the load board 220 through the first I/O connector 265 of the interposer 260, and the second I/O connector 224 of the load board 120 through the second I/O connector 266 of the interposer 260.

At block S204 of the method M2, a first semiconductor die 240 and a second semiconductor die 250 are respectively disposed on the first socket 230a and the second socket 230b. At block S206 of the method M2, a test signal to the first semiconductor die 240 and the second semiconductor die 250 through the second connector of the load board 220 are simultaneously applied by using the tester 210. For example, the test signal to the first semiconductor die 240 and the second semiconductor die 250 through the drive connector 262 of the load board 220 is simultaneously applied by using the tester 210. At block S208 of the method M2, a first signal of the first semiconductor die 240 through the first connector (e.g., first independent connector 221) of the load board 220 is read by using the tester 210. At block S210 of the method M2, whether the first semiconductor die 240 is disturbed by the second semiconductor die 250 is determined according to the first signal. In greater details, the first signal is compared with a first predetermined signal. The first predetermined signal is a signal of a new first semiconductor die or the first semiconductor die 240 isolated from the second semiconductor die 250 (e.g., when the first semiconductor die 240 is disposed on the first socket 230a and the second semiconductor die 250 is not disposed on the second socket 230b). If the first signal is substantially the same as the first predetermined signal, the first semiconductor die 240 may be not disturbed by the second semiconductor die 250; if the first signal is different from the first predetermined signal, the first semiconductor die 240 may be disturbed by the second semiconductor die 250. As such, the method M2 is beneficial for detecting signals (e.g., the first signal) of the semiconductor dies (e.g., the first semiconductor die 240). The interference (e.g., interference of the electric field) or compatibility problem between the first semiconductor die 240 and the second semiconductor die 250 can be detected.

Further, the test structure T2 include a third connector (e.g., the second independent connector 228) electrically connected to the second socket 230b but electrically isolated from the first socket 230a. At block S212 of the method M1, a second signal of the second semiconductor die 250 through the third connector (e.g., the second independent connector 228) is read by using the tester 210 after reading the first signal. At block S214, whether the second semiconductor die 250 is disturbed by the first semiconductor die 240 is determined according to the second signal. It is noted that the blocks S204, S206, S208, S210, S212, S214 of the method M2 in FIG. 3 are respectively similar to the blocks S104, S106, S108, S110, S112, S114 of FIG. 1 and the description is not repeated hereinafter. Further, it is noted that the connection relationships and materials of the tester 210, the first socket 230a, the second socket 230b, the first semiconductor die 240, and the second semiconductor die 250 of FIGS. 3-6 are similar to that of the tester 110, the first socket 130a, the second socket 130b, the first semiconductor die 140, and the second semiconductor die 150 of FIGS. 1-2 and the description is not repeated hereinafter.

In some embodiments, the interposer 260 is inserted to the load board 220, and the first socket 230a and the second socket 230b are fixed on the interposer 260, in which the first socket 230a is spaced apart from the second socket 230b. The first socket 230a is configured to hold the first semiconductor die 240 to be tested and interconnects the first semiconductor die 240 and the connectors (e.g., the first independent connector 221, the drive connector 222, the first I/O connector 223, and the second I/O connector 224) in the load board 220 through the connectors (e.g., the first independent connector 263, the drive connector 262, the first I/O connector 265, and the second I/O connector 266) in the interposer 260. The second socket 230b is configured to hold the second semiconductor die 250 to be tested and interconnects the second semiconductor die 250 and connectors (e.g., the second independent connector 228, the drive connector 222, the first I/O connector 223, and the second I/O connector 224) in the load board 220 through the connectors (e.g., the second independent connector 264, the drive connector 262, the first I/O connector 265, and the second I/O connector 266) in the interposer 260.

In some embodiments, the interposer 260 includes contact pads 231-235. The first independent connector 263 of the interposer 260 is electrically connected to the first independent connector 221 of the load board 220 through the contact pad 231, and the second independent connector 264 of the interposer 260 is electrically connected to the second independent connector 228 of the load board 220 through the contact pad 235. The contact pad 231 is spaced apart from the contact pad 235. In some embodiments, the first independent connector 263 of the interposer 260 and the first independent connector 221 of the load board 220 is electrically connected to the first socket 230a (or the first semiconductor die 240) but isolated from the second socket 230b (or the second semiconductor die 250). Similarly, the second independent connector 264 of the interposer 260 and the second independent connector 228 of the load board 220 is electrically connected to the second socket 230b (or the second semiconductor die 250) but isolated from the first socket 230a (or the first semiconductor die 240).

In some embodiments, as shown in FIG. 4, some of the contact pads (e.g., contact pad 236) of the interposer 260 are electrically isolated from any connectors (e.g., the drive connector 262, the first I/O connector 265, and/or the second I/O connector 266) of the interposer 260.

In some embodiments, the drive connector 262 of the interposer 260 is electrically connected to the drive connector 222 of the load board 220 through the contact pad 232, the first I/O connector 265 of the interposer 260 is electrically connected to the first I/O connector 223 of the load board 220 through the contact pad 233, and the second I/O connector 266 of the interposer 260 is electrically connected to the second I/O connector 224 of the load board 220 through the contact pad 234.

In some embodiments, the drive connector 262, the first I/O connector 265, and the second I/O connector 266 of the interposer 260 and the drive connector 222, the first I/O connector 223, and the second I/O connector 224 of the load board 220 are shared connecters. The first semiconductor die 240 (or the first socket 230a) is electrically connected to the second semiconductor die 250 (or the second socket 230b) through those shared connectors. In some embodiments, one of the shared connecters (e.g., the drive connector 262, the first I/O connector 265, and the second I/O connector 266) of the interposer 260 is electrically connected to one of the shared connecters (e.g., the drive connector 222, the first I/O connector 223, and the second I/O connector 224) of the load board 220. In some embodiments, the first independent connector 263 of the interposer 260 is electrically connected to the first independent connector 221 of the load board 220, and the first independent connector 263 of the interposer 260 is electrically connected to the first socket 230a but electrically isolated from the second socket 230b.

In some embodiments, the first socket 230a is disposed on a front side 260F of the interposer 260, and the second socket 230b is disposed on a back side 260B of the interposer 260. In some embodiments, the interposer 260 is a printed circuit board (PCB).

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method, comprising:
providing a test structure above a tester, wherein the test structure comprises:
a load board comprising a first connector and a second connector;
a first socket electrically connected to the first connector and the second connector of the load board; and
a second socket electrically isolated from the first connector of the load board and electrically connected to the second connector of the load board;
disposing a first semiconductor die and a second semiconductor die respectively on the first socket and the second socket;
simultaneously applying, by using the tester, a test signal to the first semiconductor die and the second semiconductor die through the second connector of the load board;
reading, by using the tester, a first signal of the first semiconductor die through the first connector; and
determining whether the first semiconductor die is disturbed by the second semiconductor die according to the first signal.

2. The method of claim 1, wherein the test structure further comprises a third connector electrically connected to the second socket but electrically isolated from the first socket, and the method further comprises:
reading, by using the tester, a second signal of the second semiconductor die through the third connector after reading the first signal; and
determining whether the second semiconductor die is disturbed by the first semiconductor die according to the second signal.

3. The method of claim 1, wherein a path length of the second connector from the tester to the first socket is substantially the same as a path length of the second connector from the tester to the second socket.

4. The method of claim 1, wherein the first semiconductor die and the second semiconductor die are dynamic random access memory (DRAM) dies.

5. The method of claim 1, wherein the first socket is fixed on a top surface of the load board.

6. The method of claim 1, wherein the test structure further comprises an interposer inserted to the load board, and the first socket and the second socket are fixed on the interposer.

7. A test structure, comprising:
a load board comprising shared connectors and independent connectors; and
a first socket and a second socket above the load board, wherein the shared connectors include a first connector, a second connector, and a third connector, and wherein the first connector, the second connector, and the third connector are electrically connected to the first socket and the second socket, wherein a path length of the first connector of the shared connectors from a surface of the load board to the first socket is substantially the same as a path length of the first connector of the shared connectors from a surface of the load board to the second socket.

8. The test structure of claim 7, wherein the independent connectors include a first independent connector electrically connected to the first socket but electrically isolated from the second socket.

9. The test structure of claim 8, wherein the independent connectors include a second independent connector electrically connected to the second socket but electrically isolated from the first socket.

10. The test structure of claim 7, wherein the first socket is fixed on a top surface of the load board.

11. The test structure of claim 7, wherein the first connector of the shared connectors extends from a bottom surface of the load board to a top surface of the load board, wherein the top surface of the load board is in contact with the first socket and the second socket.

12. The test structure of claim 7, further comprising:
an interposer inserted to the load board, and the first socket and the second socket are fixed on the interposer.

13. The test structure of claim 12, wherein the interposer includes a first connector electrically connected to the first connector of the shared connectors of the load board.

14. The test structure of claim 12, wherein the interposer includes a second connector electrically connected to one of the independent connectors of the load board, and the second connector of the interposer is electrically connected to the first socket but electrically isolated from the second socket.

15. A test structure, comprising:
a load board comprising shared connectors and independent connectors;
a first socket and a second socket above the load board, wherein the shared connectors include a first connector, a second connector, and a third connector, and wherein the first connector, the second connector, and the third connector are electrically connected to the first socket and the second socket; and
an interposer inserted to the load board, wherein the first socket and the second socket are fixed on the interposer.

* * * * *